United States Patent
Morimoto et al.

(10) Patent No.: US 6,933,570 B2
(45) Date of Patent: Aug. 23, 2005

(54) SEMICONDUCTOR DEVICE EQUIPPED WITH FUEL CELL AND METHOD FOR PRODUCING THE SAME

(75) Inventors: Kiyoshi Morimoto, Hirakata (JP); Kiyoyuki Morita, Yawata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/696,347

(22) Filed: Oct. 28, 2003

(65) Prior Publication Data

US 2004/0099907 A1 May 27, 2004

Related U.S. Application Data

(63) Continuation of application No. PCT/JP03/00618, filed on Jan. 23, 2003.

(30) Foreign Application Priority Data

Jan. 29, 2002 (JP) .......................................... 2002-019659

(51) Int. Cl.$^7$ ............................. H01L 27/01; H01M 4/86
(52) U.S. Cl. ........................ 257/347; 257/350; 257/368; 429/44
(58) Field of Search ................................. 257/347, 350, 257/368, 401, 614, 615; 429/44

(56) References Cited

U.S. PATENT DOCUMENTS

| 4,525,437 | A | 6/1985 | Yamazaki |
| 4,528,252 | A | 7/1985 | Yamazaki |
| 5,650,650 | A | 7/1997 | Ohmi et al. |
| 5,945,712 | A | 8/1999 | Kim |
| 6,022,765 | A | 2/2000 | Kim |
| 6,255,731 | B1 | 7/2001 | Ohmi et al. |
| 2004/0099907 | A1 * | 5/2004 | Morimoto et al. ......... 257/341 |

FOREIGN PATENT DOCUMENTS

| JP | 6-244416 | 9/1994 |
| JP | 8-18009 | 1/1996 |
| JP | 8-18015 | 1/1996 |
| JP | 10-70281 | 3/1998 |
| JP | 11-103035 | 4/1999 |
| JP | 2002-75399 | 3/2002 |
| WO | 00/69007 | 11/2000 |
| WO | 01/80286 | 10/2001 |

OTHER PUBLICATIONS

"Fabrication of Micro Power Source (MPS) using a Micro Direct Methanol Fuel Cell ($\mu$ DMFC) for the Medical Application", Woo Young Sim et al., The 14$^{th}$ IEEE International Conference on Micro Eleectro Mechanical Systems 2001, pp. 341–344.

"A Miniature Methanol/Air Polymer Electrolyte Fuel Cell", S.C. Kelley et al. Electrochemical and Solid–State Letters, 3 (9) 407–409 (2000).

* cited by examiner

*Primary Examiner*—Mark V. Prenty
(74) *Attorney, Agent, or Firm*—Hamre, Schumann, Mueller & Larson, P.C.

(57) ABSTRACT

A semiconductor device equipped with a fuel cell of the present invention includes a fuel cell and a semiconductor element, and the fuel cell includes an anode separator in which a flow channel for fuel is formed, a cathode separator in which a flow channel for oxidizer is formed, and a membrane electrode assembly interposed between the anode separator and the cathode separator. In the semiconductor device, the semiconductor element is formed on one of the principal surfaces of one separator selected from the anode separator and the cathode separator, and the semiconductor element and the selected separator are connected electrically. With this configuration of the semiconductor device equipped with a fuel cell, a more compact and versatile semiconductor device equipped with a fuel cell is provided.

19 Claims, 11 Drawing Sheets

SEMICONDUCTOR DEVICE EQUIPPED WITH FUEL CELL AND METHOD FOR PRODUCING THE SAME

BACKGROUND OF THE INVENTION

1. Field of the Invention

The present invention relates to a semiconductor device equipped with a fuel cell, and a method for producing the same.

2. Related Background Art

Currently, semiconductor devices as devices equipped with semiconductor elements are used widely in various fields, for example, in the field of electronic equipment, and the uses of the same continue increasing further. Besides, tiny semiconductor devices such as micromachines have drawn attention recently.

If such a semiconductor device per se can be equipped with a power source (i.e., it is a semiconductor device equipped with a power source), further superiority in versatility is provided to the semiconductor device. In this case, a generally used secondary battery such as a lithium battery may be used as a power source. However, with the current second battery technology, a power source having a considerably large size as compared with that of a semiconductor element is required due to output characteristics of the secondary battery. Therefore, the miniaturization of a semiconductor device equipped with a power source has a limit. Further, since a battery has to be charged or replaced when the battery is exhausted, there is a problem in versatility. Furthermore, the recycling of secondary batteries is expected to become a significant social issue in the future. Considering these situations, further compact and versatile semiconductor devices equipped with power sources are sought.

SUMMARY OF THE INVENTION

Therefore, it is an object of the present invention to provide a compact and versatile semiconductor device equipped with a fuel cell as a power source, and a method for producing the same.

To achieve the foregoing object, a semiconductor device equipped with a fuel cell (hereinafter sometimes referred to simply as "semiconductor device") of the present invention includes a fuel cell and a semiconductor element, and the fuel cell includes an anode separator in which a flow channel for fuel is formed, a cathode separator in which a flow channel for oxidizer is formed, and a membrane electrode assembly interposed between the anode separator and the cathode separator. In the semiconductor device, the semiconductor element is formed on one of principal surfaces of one separator selected from the anode separator and the cathode separator, and the semiconductor element and the selected separator are connected electrically.

The foregoing semiconductor device may include two of the semiconductor elements, which are a first semiconductor element formed on one of the principal surfaces of the anode separator, and a second semiconductor element formed on one of the principal surfaces of the cathode separator.

In the foregoing semiconductor device, the selected separator may be formed with a semiconductor substrate.

In the foregoing semiconductor device, the semiconductor substrate may be made of crystalline silicon.

In the foregoing semiconductor device, the semiconductor substrate may be made of a compound semiconductor containing an element of the group IIIb and an element of the group Vb.

In the foregoing semiconductor device, the semiconductor substrate may be made of a compound semiconductor containing an element of the group IIb and an element of the group VIb.

In the foregoing semiconductor device, the anode separator may be formed with a N-type semiconductor substrate and the cathode separator with a P-type semiconductor substrate.

In the foregoing semiconductor device, the fuel cell further may include a contact layer arranged between the selected separator and the membrane electrode assembly so as to reduce a contact resistance between the selected separator and the membrane electrode assembly.

In the foregoing semiconductor device, the fuel cell may further include an insulation layer formed between the semiconductor element and the selected separator.

In the foregoing semiconductor device, the semiconductor element is connected electrically with the selected separator via an electrode formed in the insulation layer.

In the foregoing semiconductor device, the insulation layer may be made of $SiO_2$.

In the foregoing semiconductor device, the insulation layer has a specific resistance of not less than $10^5$ Ω·cm.

In the foregoing semiconductor device, the insulation layer may have a thickness in a range of 10 nm to 1 μm.

In the foregoing semiconductor device, the selected separator may be made of a metal.

In the foregoing semiconductor device, the insulation layer may be a metal oxide film.

The foregoing semiconductor device may be configured so that the semiconductor element includes a first electrode and a second electrode, the first electrode is connected electrically with the anode separator, and the second electrode is connected electrically with the cathode separator.

The foregoing semiconductor device may be configured so that the semiconductor element is a N-channel MOS transistor, a source electrode and a substrate electrode of the N-channel MOS transistor are connected electrically with the anode separator, and a drain electrode and a gate electrode of the N-channel MOS transistor are connected electrically with the cathode separator.

The foregoing semiconductor device may be configured so that the semiconductor element is a P-channel MOS transistor, a source electrode and a gate electrode of the P-channel MOS transistor are connected electrically with the anode separator, and a drain electrode and a substrate electrode of the P-channel MOS transistor are connected electrically with the cathode separator.

In the foregoing semiconductor device, the fuel cell may be formed by stacking a plurality of cells, each of which includes the anode separator, the cathode separator, and the membrane electrode assembly.

A method of the present invention for producing a semiconductor device equipped with a fuel cell is a method for producing a semiconductor device equipped with a fuel cell having a structure in which a membrane electrode assembly is interposed between a pair of separators. The method includes the steps of: (i) forming a semiconductor element on one surface of a semiconductor substrate; (ii) forming a flow channel through which either fuel or oxidizer is to flow on a surface of the semiconductor substrate that is opposite to the surface on which the semiconductor element is formed; and (iii) laminating the membrane electrode assembly on the semiconductor substrate so that the surface of the semiconductor substrate with the flow channel thereon is in contact with the membrane electrode assembly, wherein the semiconductor substrate serves as one separator selected from the pair of separators.

In the foregoing method, the semiconductor substrate may include an insulation layer between the surface with the semiconductor element thereon and the surface with the flow channel thereon.

In the foregoing method, the step (i) may include a sub-step of: (a) forming the semiconductor element on the insulation layer in a manner such that the semiconductor element and the semiconductor substrate are connected electrically with each other via an electrode formed in the insulation layer.

Another method of the present invention for producing a semiconductor device equipped with a fuel cell is a method for producing a semiconductor device equipped with a fuel cell having a structure in which a membrane electrode assembly is interposed between a pair of separators. The method includes the steps of: (I) forming a flow channel through which either fuel or oxidizer is to flow on a surface of the semiconductor substrate; (II) forming a semiconductor element on a surface of the semiconductor substrate that is opposite to the surface on which the flow channel is formed; and (III) laminating the membrane electrode assembly on the semiconductor substrate so that the surface of the semiconductor substrate with the flow channel thereon is in contact with the membrane electrode assembly, wherein the semiconductor substrate serves as one separator selected from the pair of separators.

In the foregoing method, the semiconductor substrate may include an insulation layer between the surface with the flow channel thereon and the surface with the semiconductor element thereon.

In the foregoing method, the step (II) may include a sub-step of: (A) forming the semiconductor element on the insulation layer in a manner such that the semiconductor element and the semiconductor substrate are connected electrically with each other via an electrode formed in the insulation layer.

DETAILED DESCRIPTION OF THE INVENTION

Figure 1:
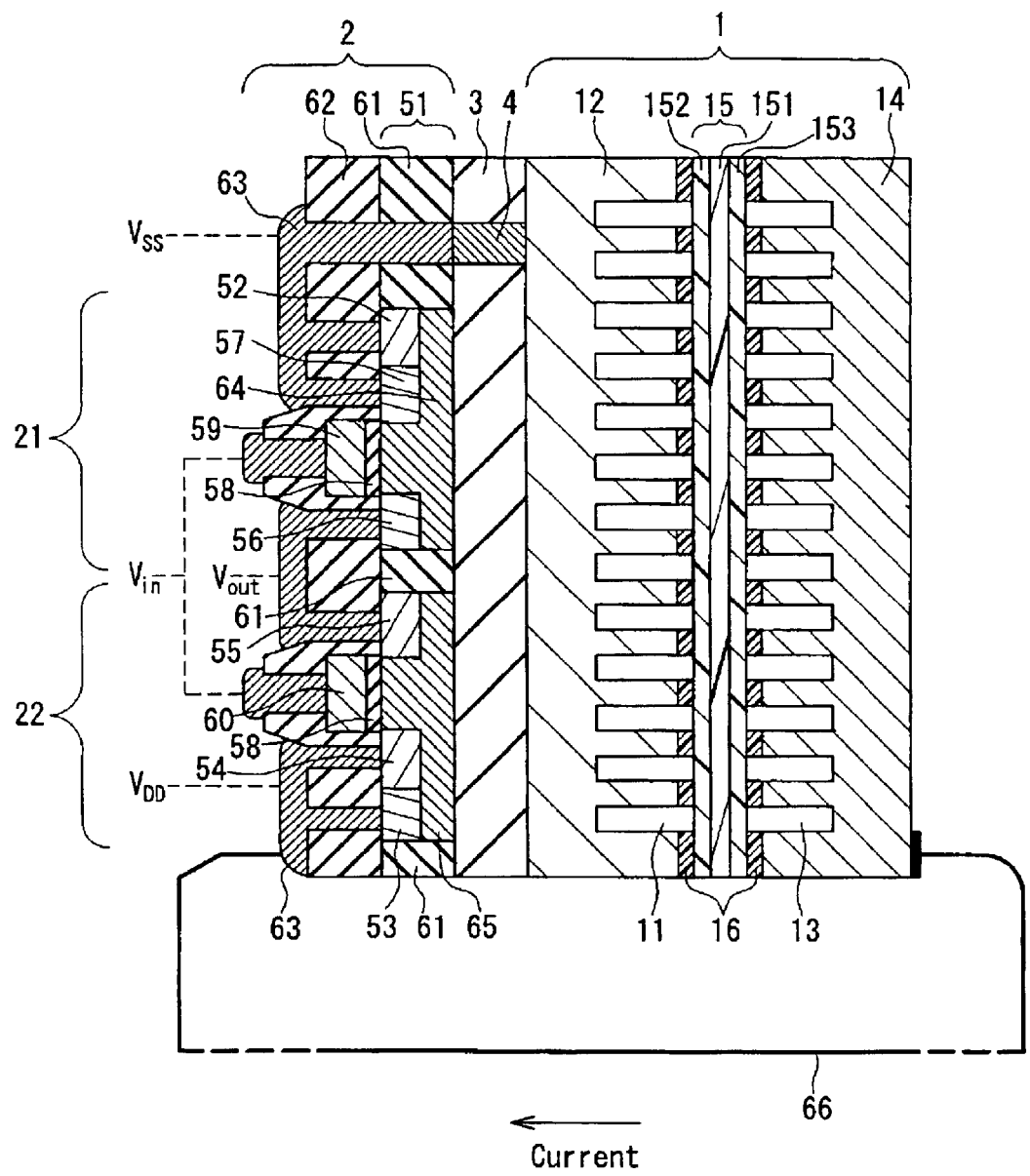
FIG. 1 is a schematic cross-sectional view illustrating an example of a semiconductor device equipped with a fuel cell according to the present invention.

The following will describe embodiments of the present invention. In the following descriptions of embodiments, the same members will be indicated by the same reference numerals, and descriptions thereof are omitted in some cases.

First Embodiment

FIG. 1 is a cross-sectional view illustrating an example of a semiconductor device equipped with a fuel cell (hereinafter sometimes referred to as semiconductor device) according to the present invention. The semiconductor device shown in FIG. 1 is equipped with a fuel cell 1 and a semiconductor element 2. The fuel cell 1 includes an anode separator 12 in which flow channels 11 for fuel are formed, a cathode separator 14 in which flow channels 13 for oxidizer are formed, and a membrane electrode assembly (MEA) 15 that is interposed between the anode separator 12 and the cathode separator 14. Further, the semiconductor element 2 is formed on one of the principal surfaces of one separator selected from the anode separator 12 and the cathode separator 14 (in the example shown in FIG. 1, on one principal surface of the anode separator 12) so that the semiconductor element 2 and the one separator (i.e., the anode separator 12 in the example of FIG. 1) are connected electrically with each other.

In such a semiconductor device, the fuel cell and the semiconductor element are provided integrally, and the fuel cell as a power source has the following characteristics: it has a high energy density (for instance, it can be increased by one or more orders as compared with a lithium secondary battery as a typical secondary battery); it does not require charging, replacement, or the like as is the case with the battery when it is exhausted; and it starts electric power generation immediately when fuel is supplied. Therefore, this configuration can provide the semiconductor device having excellent compactness and versatility. Further, since it basically generates electrical power as long as fuel is supplied, the problem of recycling can be minimized as compared with the secondary battery.

Furthermore, in the example shown in FIG. 1, the semiconductor element 2 is formed on an insulation layer 3 arranged on one principal surface of the anode separator 12 as the aforementioned one separator (in other words, an insulation layer 3 is formed between the semiconductor element 2 and the foregoing one separator), and the semiconductor element 2 and the foregoing one separator are connected electrically via an electrode 4 formed in the insulation layer 3.

Thus, by arranging the insulation layer 3 between the semiconductor element 2 and the foregoing one separator (by forming the semiconductor element 2 on the insulation layer 3 in the example of FIG. 1), an area of the semiconductor element is reduced, whereby a degree of integration of the semiconductor element can be increased further. Furthermore, this semiconductor device can configure a so-called SOI (silicon on insulator) transistor, which is capable of operating at a high speed even with a power supply voltage in a low-voltage range of not more than 1 V.

Such a SOI transistor, which has been commercialized for practical use in a wristwatch or the like, can be actuated even if a fuel cell 1 is a single cell, since it can operate with a voltage of not more than 1 V. Moreover, since this also makes it possible to reduce the power consumption of the semiconductor element 2, this causes a circuit to operate for a longer period. Therefore, this can provide the semiconductor device having further excellent compactness and versatility. Furthermore, since the insulation layer generally has a low thermal conductivity, heat generated by the fuel cell 1 can be prevented from being transmitted to the semiconductor element 2.

Next, the fuel cell 1 in the semiconductor device shown in FIG. 1 will be described below.

The fuel cell 1 includes a configuration in which the MEA 15 is interposed between the anode separator 12 and the cathode separator 14. The flow channels 11 for fuel are formed in the anode separator 12, while the flow channels 13 for oxidizer are formed in the cathode separator 14. The MEA 15 may be at least in contact with surfaces of the respective separators where the foregoing flow channels are formed. With the supply of the fuel and the oxidizer to the MEA 15 through the flow channels 11 and 13, the electric power generation is carried out. Further, the anode separator 12 and the cathode separator 14 also function as charge collectors for collecting the electric power generated in the MEA 15.

The structure, material, size, and shape of the MEA 15 are not limited particularly, as long as the MEA 15 is capable of generating electric power with supply of a fuel and an oxidizer. They may be set appropriately according to types of a fuel and an oxidizer for use in the electric power generation, a temperature range in which the electric power generation is carried out, required characteristics of the electric power generation, etc. An example of the structure of the MEA 15 is, for instance, such that anode electrodes 152 and cathode electrodes 153 are applied or printed on opposed surfaces of a film 151 made of a polyelectrolyte. Further, a certain layer such as a diffusion layer may be provided additionally in the MEA as required.

For forming the MEA 15, in the case where, for instance, hydrogen gas and air are used as the fuel and the oxidizer, respectively, a polyelectrolyte having a hydrogen ion conductivity such as perfluoroethylene sulfonic acid-based polymer may be used as a material for forming the film 151, and a carbon material containing fine particles of platinum may be used as a material for forming the anode electrodes 152 and the cathode electrodes 153. In this case, the fuel cell 1 is a so-called PEFC (polyelectrolyte fuel cell), which is capable of generating electric power in a relatively low temperature range (for instance, in a range of 0° C. to 100° C.). By setting the electric power generation temperature to, for instance, not higher than 80° C., the influence of heat on the semiconductor element 2 can be minimized. Further, since the PEFC has a particularly high energy density among fuel cells, it is capable of obtaining necessary electric power even if it is of a small size. Therefore, this can provide the semiconductor device having further excellent compactness and versatility.

The fuel and oxidizer supplied to the fuel cell 1 are not limited particularly, as long as they allow the fuel cell 1 to generate electric power. They may be selected appropriately according to the temperature range in which the electric power generation is carried out, required characteristics of the electric power generation, etc. As the oxidizer, air, for instance, may be used. Examples of the fuel include not only a gas such as hydrogen but also a liquid such as methanol.

In the case where methanol is used as the fuel, the fuel cell 1 is a DMFC (direct methanol fuel cell) as one type of the PEFC. In this case, as compared with the case where a gas such as hydrogen is used as the fuel, the supply of the fuel is carried out more easily. For instance, a cartridge of the fuel may be used for carrying out the supply of the fuel.

Furthermore, a method for supplying the fuel and oxidizer to the fuel cell 1 is not limited particularly. For instance, they may be supplied to the corresponding flow channels of the separators using devices such as pumps. In the case where air is used as the oxidizer, the flow channels in the cathode separator may be opened to the atmosphere. An example wherein the foregoing flow channels are opened to the atmosphere will be described in the third embodiment.

In the semiconductor device shown in FIG. 1, a material used for forming the anode separator 12 is not limited particularly, as long as the anode separator 12 thus formed functions as a charge collector (in other words, as long as the anode separator 13 thus formed has a conductivity of not lower than a certain level), and allows the insulation layer 3 to be formed on one of principal surfaces of the anode separator 12. It should be noted that the use of a material having a specific resistance of, for instance, not more than 100 Ω·cm is recommendable so as to allow the anode separator 12 to function as a charge collector. More specifically, for instance, the anode separator 12 may be formed using a substrate made of carbon such as graphite, a substrate made of a metal such as stainless steel, or a semiconductor substrate.

Furthermore, a material used for forming the cathode separator 14 is not limited particularly, as long as the cathode separator 14 thus formed functions as a charge collector (in other words, as described above, as long as the cathode separator 14 formed has a conductivity of not lower than a certain level). More specifically, for instance, the cathode separator 14 may be formed using a substrate made of carbon such as graphite, a substrate made of a metal such as stainless steel, or a semiconductor substrate. It should be noted that the material used for forming the anode separator 12 and the material used for forming the cathode separator 14 may be the same, or may be different.

A semiconductor substrate made of crystalline silicon, for instance, may be used for forming a separator, irrespective of whether it is the anode separator 12 or the cathode separator 14. However, in the case where pure crystalline silicon is used, the separator obtained sometimes does not have a sufficient conductivity as a charge collector. In such a case, the semiconductor substrate may be doped with an impurity such as an element of the group IIb, the group IIIb, the group Vb, the group VIb, or the like, so as to have an increased conductivity. It should be noted that an impurity may be doped in an entirety of the semiconductor substrate, or alternatively, only in a part that requires the doping.

In the case where crystalline silicon is doped with an impurity, the semiconductor substrate has either N-type or P-type conductivity, depending on the type of the impurity. For forming the separator, a semiconductor substrate of any type of conductivity, the P-type or the N-type, may be used. The conductivity of the anode separator and that of the cathode separator may be the same type, or may be different types.

Among others, a particular case is preferable where the anode separator 12 is formed with a N-type semiconductor substrate and the cathode separator 14 is formed with a P-type semiconductor substrate. In this case, the flow of electrons from the anode to the cathode can be made smoother, whereby the characteristics of the fuel cell 1 can be enhanced further. Therefore, this can make the semiconductor device more excellent in versatility.

In addition to the foregoing examples, examples of the semiconductor substrate used herein include substrates composed of compound semiconductors containing elements of the group IIIb and the group Vb, such as GaN, GaP, GaAs, etc. Further, examples of the semiconductor substrate used herein also include substrates composed of compound semiconductors containing elements of the group IIb and the group VIb, such as ZnS, ZnSe, etc.

The use of the semiconductor substrate for forming the separator allows the semiconductor processing process to be applied therein, thereby allowing the flow channels and the like to be formed by micromachining. For instance, it is possible to form a thin fuel cell with an overall thickness of less than 1.5 mm. Further, the semiconductor substrate is chemically stable, and in a PEFC, the corrosion of the separator can be suppressed to a minimum level, even in the flow channels therein that are considered to be in a strongly acid atmosphere. Further, since the fuel does not pass through the semiconductor substrate, even in the case where a minute separator is formed, a leakage of the fuel through the separator can be suppressed to a minimum level. Furthermore, since the already available semiconductor processing process is applicable for the production, the separator can be formed integrally with the semiconductor element, whereby the semiconductor device can be produced with improved productivity.

Among others, crystalline silicon has various advantages such as the abundance in the earth of silicon as its raw material, the harmlessness to human bodies, and the inexpensiveness. Moreover, a semiconductor substrate made of crystalline silicon is superior in the uniformess of the thickness and the flatness of the surfaces, and therefore the combination of the crystalline silicon substrate and the silicon micromachining technology enables processing with significant accuracy. Further, in the case where a large-diameter silicon wafer is subjected to a batch processing in a semiconductor processing line, a number of separators on the same wafer can be formed simultaneously. This enables low-cost production of separators.

Still further, some crystalline silicon substrates available in the market have a specific resistance of, for instance, not more than about 10 m$\Omega$·cm. In the case where a separator is formed with such a substrate, the separator with a thickness of, for instance, 650 $\mu$m has a resistance per unit area of approximately 0.65 m$\Omega$/cm$^2$ (without taking contact resistance into consideration). This proves that the separator formed with a crystalline silicon substrate is capable of sufficiently functioning as a charge collector of a fuel cell. For example, in the case where electric current with a current density of 100 mA/cm$^2$ is outputted, the resistance overvoltage of the separator is approximately 65 $\mu$V, which is considered to be sufficiently small as compared with an output voltage of a fuel cell (for instance, an open-circuit voltage (OCV) is approximately 1.1 V in the case where hydrogen is used as fuel).

In the semiconductor device shown in FIG. 1, a thickness of the anode separator 12 and that of the cathode separator 14 are not limited particularly, as long as the flow channels for the fuel and the oxidizer can be formed. In the case where the separators are formed with semiconductor substrates, the thickness is, for example, in a range of 10 $\mu$m to 1 mm. More specifically, in the case where a common 6-inch silicon substrate is used for forming a separator, for example, the thickness of the separator is approximately 650 $\mu$m.

Furthermore, a size and a shape of the flow channels for the fuel and the oxidizer, and a percentage of the flow channels in an area of the separator are not limited particularly, as long as the fuel and the oxidizer can be supplied to the MEA. They may be set appropriately according to the thickness of the separator itself, required electric power generation characteristics, etc. For instance, in the example shown in FIG. 1, thirteen flow channels are formed in one separator, but the number of the flow channels may be set freely. The flow channels may be formed with a single flow channel in a bent form.

In the case where a separator is formed with a semiconductor substrate, each of the flow channels may be formed, for instance, in a rectangular shape with a width in a range of 10 $\mu$m to 200 $\mu$m, a depth in a range of 10 $\mu$m to 500 $\mu$m, and a space between adjacent flow channels (pitch) in a range of 10 $\mu$m to 100 $\mu$m.

It should be noted that though the separators are formed and arranged so that a direction of the flow channels for the fuel and a direction of the flow channels for the oxidizer are parallel with each other in the example shown in FIG. 1, the semiconductor device of the present invention is not limited to this configuration particularly. The flow channels of the respective separators may face each other so that respective directions thereof form a certain relative angle. For instance, the separators may be formed and arranged so that the respective directions of the flow channels thereof cross perpendicularly.

The semiconductor device shown in FIG. 1 may include a contact layer 16 for reducing contact resistance between the anode separator 12 as the foregoing one separator and the MEA 15 so that the contact layer 16 is interposed between the anode separator 12 and the MEA 15.

In this semiconductor device, the characteristics of the fuel cell 1 can be enhanced further, since the resistance overvoltage of the fuel cell 1 can be reduced. Therefore, this can make the semiconductor device further excellent in versatility. It should be noted that as shown in FIG. 1, the contact layer may be arranged between the cathode separator 14 and the MEA 15. The contact layer has a thickness, for instance, in a range of 0.01 $\mu$m to 10 $\mu$m, preferably in a range of 0.01 $\mu$m to 0.5 $\mu$m. Further, the contact layer is not necessarily arranged over an entirety of a surface of the separator, and a region where the contact layer is arranged may be determined appropriately.

The contact layer 16 is not limited particularly, as long as the contact resistance between the separator and the MEA is reduced. For instance, in the case where the separator is formed with a semiconductor substrate, a degenerated impurity-diffused layer having the same conductivity as the foregoing semiconductor substrate may be formed on the semiconductor substrate so as to serve as the contact layer. An example of a method for forming the impurity-diffused layer is such that ions of phosphor (P), arsenic (As), boron (B), or the like as an impurity are implanted at a dose of not less than $10^{14}$/cm$^2$ in a semiconductor substrate such as a crystalline silicon substrate, and are diffused therein. Besides, a metal silicide layer may be laminated over the impurity-diffused layer so that a laminated film of the impurity-diffused layer and the metal silicide layer serves as the contact layer. Furthermore, the foregoing laminate may further include another layer as required. The metal silicide layer may be made of, for instance, platinum silicide, cobalt silicide, molybdenum silicide, nickel silicide, or the like. A specific example of forming such a contact layer will be described later in the sixth embodiment.

The following will describe the insulation layer 3 in the semiconductor device shown in FIG. 1.

A material used for forming the insulation layer 3 is not limited particularly, as long as it is formed between the semiconductor element 2 and the anode separator 12. For instance, SiO$_2$, glass, a metal oxide film, or the like may be used as the material. The material used may have a specific resistance in a range of, for instance, not less than $10^5$ Ω·cm. The insulation layer 3 may be formed by causing the foregoing material to adhere to the anode separator.

In the case where the anode separator 12 is formed on the semiconductor substrate made of a crystalline silicon, the insulation layer 3 may be an insulation layer made of SiO$_2$, for instance. In this case, it is possible to form the anode separator 12, the insulation layer 3, and the semiconductor element 2 by processing a SOI (silicon on insulator) substrate available in the market, and this can make the semiconductor device more excellent in stability and versatility. Further, this makes it possible to produce the semiconductor device with improved productivity.

In the case where the anode separator 12 is formed with a substrate made of a metal, the insulation layer 3 may be formed with a film of an oxide of the same metal. In this case, the insulation layer 3 can be formed by oxidizing a surface of the substrate made of the metal, and therefore, this can make the semiconductor device more excellent in stability and versatility. Further, this also makes it possible to produce the semiconductor device with improved productivity. Further, since the separator itself is made of a metal, the separator is caused to have a significantly small specific resistance in the μΩ·cm order, and therefore, this further can reduce the resistance overvoltage of the fuel cell.

Likewise, in the case where a material used for forming the insulation layer 3 is an oxide of the material used for forming the anode separator 12, the insulation layer 3 can be formed by oxidizing a surface of the anode separator 12. Therefore, this makes it possible to produce the semiconductor device with further improved productivity.

The thickness of the insulation layer 3 is not limited particularly, as long as the insulation between the anode separator 12 and the semiconductor element 2 can be secured. For instance, it may be not less than 10 nm. In the case where the anode separator 12 is formed with a semiconductor substrate made of crystalline silicon and the insulation layer 3 is made of SiO$_2$, the insulation layer 3 has a thickness in a range of, for instance, 10 nm to 1 μm. It should be noted that since the insulation layer 3 generally has a small thermal conductivity, an increase in the thickness of the insulation layer 3 can suppress the transmission of heat from the fuel cell 1 to the semiconductor element 2.

Further, the insulation layer 3 has a via hole in which the electrode 4 is formed (the electrode 4 electrically connects the semiconductor element 2 with the anode separator 12). The size of the via hole may be set according to the electrode 4, and is not limited particularly. For instance, it may have a cross-sectional area of not more than 1 μm$^2$. Still further, though the insulation layer 3 shown in FIG. 1 has only a single via hole, the number of the via holes is not limited particularly. A plurality of the via holes may be provided as required. As a material for forming the electrode 4, tungsten, aluminum, copper, or the like may be used. The electrode 4 may be provided integrally with element wiring 63 of the semiconductor element 2.

The following will describe the semiconductor element 2 in the semiconductor device shown in FIG. 1.

In the semiconductor device shown in FIG. 1, a CMOS inverter composed of an N-channel MOS transistor 21 and a P-channel MOS transistor 22 is formed, as the semiconductor element 2, on a crystalline silicon layer 51. The CMOS inverter is a common CMOS inverter that includes a P-well contact layer 52, a N-well contact layer 53, a P-type source electrode 54, a P-type drain electrode 55, a N-type drain electrode 56, a N-type source electrode 57, gate insulation films 58, a N-type gate electrode 59, a P-type gate electrode 60, an element separation insulation film 61, interlayer insulation films 62, element wiring 63, a P-well 64, and a N-well 65. Materials used in the foregoing respective regions, thicknesses and sizes of the foregoing regions are not limited particularly. For instance, they may be identical to those of a common semiconductor element.

In the example shown in FIG. 1, the CMOS inverter as a semiconductor element is formed on the crystalline silicon layer 51. Here, in the case where the insulation layer 3 is made of SiO$_2$, the anode separator 12, the insulation layer 3, and the semiconductor element 2 can be formed by processing a SOI substrate available in the market, and this can make the semiconductor device more excellent in stability and versatility. Further, this makes it possible to produce the semiconductor device with improved productivity. The thickness of the crystalline silicon layer 51 is not limited particularly. For instance, it is in a range of 0.01 μm to 10 μm. Besides, the crystalline silicon layer 51 has a specific resistance in a range of, for instance, 1 mΩ·cm to 1 kΩ·cm.

The semiconductor element in the semiconductor device of the present invention may be configured so as to include first and second electrodes, the first electrode being connected electrically with the anode separator and the second electrode being connected electrically with the cathode separator. For instance, in the example shown in FIG. 1, a ground potential electrode ($V_{SS}$ shown in FIG. 1) of the CMOS inverter as the semiconductor element is connected electrically with the anode separator 12 via the electrode 4 formed in the insulation layer 3. Electrons are supplied via this route to a load circuit of the CMOS inverter. Besides, a power supply electrode ($V_{DD}$ shown in FIG. 1) of the CMOS inverter is connected electrically with the cathode separator 14 via external wiring 66. This allows electric current from the fuel cell 1 to flow into the power supply electrode of the CMOS inverter via the external wiring 66. It should be noted that input and output electrodes of the CMOS inverter are denoted as $V_{in}$ and $V_{out}$ in FIG. 1. Further, the electrode 4 and the ground potential electrode $V_{SS}$ may be provided integrally.

In the semiconductor device shown in FIG. 1, in the case where the anode separator 12 is formed with a semiconductor substrate, the aforementioned contact layer or metal thin film layer may be arranged between the electrode 4 and the anode separator 12. This can reduce a contact resistance between the electrode 4 and the anode separator 12. Likewise, in the case where the cathode separator 14 is formed with a semiconductor substrate, the aforementioned contact layer or metal thin film layer may be arranged between the external wiring 66 and the cathode separator 14. In the semiconductor device thus configured, electric power generated by the fuel cell 1 is transmitted to the semiconductor element 2 efficiently. Thus, this can provide the semiconductor device having more excellent compactness and versatility. It should be noted that in this case, the contact layer has a thickness, for instance, in a range of 0.01 μm to 10 μm, and a region where the contact layer is arranged may be determined appropriately.

The type of the semiconductor element in the semiconductor device of the present invention is not limited particularly. For instance, a MOS transistor, a bipolar transistor, a light-emitting diode, or a semiconductor laser may be formed. It should be noted that the semiconductor element 2 shown in FIG. 1 is a silicon semiconductor element, but it may be a semiconductor element formed using another material, for instance, a compound semiconductor element made of GaN, SiC, or the like. Since such a compound semiconductor element can be used in a temperature range of not lower than 100° C., it can be provided integrally with a fuel cell of a type that operates at a high temperature as compared with the case of a common PEFC. Further, the semiconductor element may be formed by a common semiconductor element forming method.

It should be noted that though the semiconductor element 2 is formed on one of the principal surfaces of the anode separator 12 in the example shown in FIG. 1, the semiconductor device of the present invention is not limited to this configuration particularly. The semiconductor element 2 may be formed on, for instance, one of the principal surfaces of the cathode separator 14. Further, the semiconductor device of the present invention may be configured so as to include first and second semiconductor elements, the first semiconductor element being formed on one of the principal surfaces of the anode separator and the second semiconductor element being formed on one of the principal surfaces of the cathode separator. In other words, semiconductor elements may be formed on principal surfaces of both of the anode separator and the cathode separator. This configuration can render the semiconductor device more excellent compactness and versatility.

Furthermore, though an insulation layer 3 is arranged between the fuel cell 1 and the semiconductor element 2 in the example shown in FIG. 1, the semiconductor device of the present invention is not limited to this configuration. A semiconductor element may be formed directly on one of the principal surfaces of the anode separator. In the case where the semiconductor element is formed directly on the separator, the separator may be formed with a semiconductor substrate. It should be noted that the position where the semiconductor element is formed is not limited to a position on the anode separator. The semiconductor element may be formed on one of the principal surfaces of the cathode separator, or semiconductor elements may be formed on principal surfaces of both of the anode separator and the cathode separator.

It should be noted that the semiconductor device of the present invention can be used in an electronic circuit apparatus as shown in FIG. 1, a light source, a power source, a micromachine, a microsensor, or the like.

Second Embodiment

Figure 2:
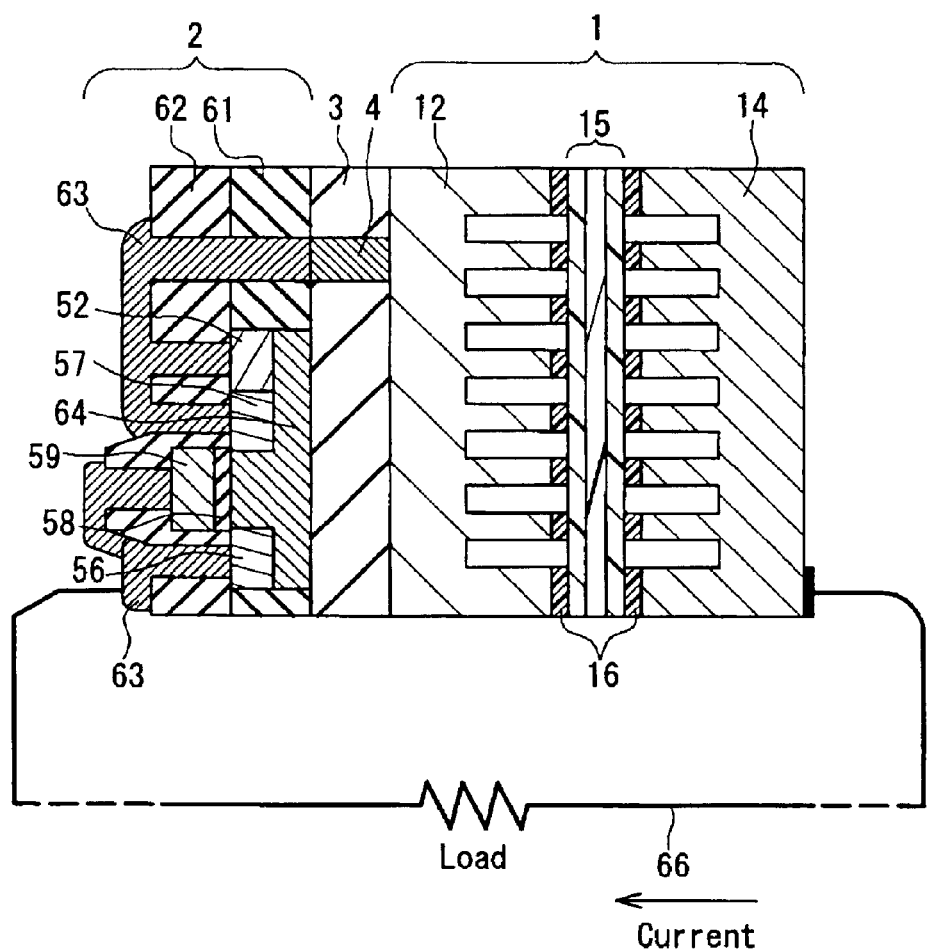
FIG. 2 is a schematic cross-sectional view illustrating another example of a semiconductor device equipped with a fuel cell according to the present invention.

FIG. 2 is a cross-sectional view schematically illustrating another example of a semiconductor device of the present invention.

The semiconductor device shown in FIG. 2 includes a fuel cell 1 and a semiconductor element 2. The fuel cell 1 includes an anode separator 12, a cathode separator 14, and a MEA 15 that is interposed between the anode separator 12 and the cathode separator 14. Besides, contact layers 16 are arranged between the respective separators and the MEA 15, so that electric power generated by the MEA 15 can be collected more efficiently.

Further, the semiconductor element 2 is formed on an insulation layer 3 arranged on one of principal surfaces of the anode separator 12 so that the semiconductor element 2 and the anode separator 12 are connected electrically with each other via an electrode 4 formed in the insulation layer 3.

The semiconductor element 2 is a N-channel MOS transistor that includes a P-well contact layer 52, a N-type drain electrode 56, a N-type source electrode 57, gate insulation films 58, a N-type gate electrode 59, an element separation insulation film 61, interlayer insulation films 62, element wiring 63, and a P-well 64. As shown in FIG. 2, the source electrode and a substrate electrode of the foregoing N-channel MOS transistor are connected electrically with the anode separator 12 via an electrode 4, and the drain electrode and the gate electrode of the same are connected electrically with the cathode separator 14 via external wiring 66. At a certain midpoint of the external wiring 66, an external load is connected to which power generated by the fuel cell 1 is supplied.

In this semiconductor device, in the case where an output voltage of the fuel cell 1 is not lower than a threshold voltage of the N-channel MOS transistor, the transistor is ON permanently and is capable of supplying power to the external load. However, when the output voltage of the fuel cell 1 is not higher than the threshold voltage, the transistor is turned OFF, and the power supply to the external load is stopped. For example, in the case where the foregoing threshold value is set to a lower limit voltage of the fuel cell (the lowest voltage that the fuel cell generates power safely), it is possible to prevent a malfunction of an electronic device due to a problem of the fuel cell or damage occurring to the fuel cell due to an excessive decrease in the voltage of the fuel cell. Furthermore, by setting a channel size of the transistor to an appropriate value, the semiconductor device (power source) can be made to have a function as a limiter with respect to the output current of the fuel cell 1. It should be noted that the threshold voltage of the transistor can be controlled by adjusting the concentration of an impurity diffused in the P-well 64, a thickness of the gate insulation film 58, and a material (work function) of the N-type gate electrode 59.

Figure 3:
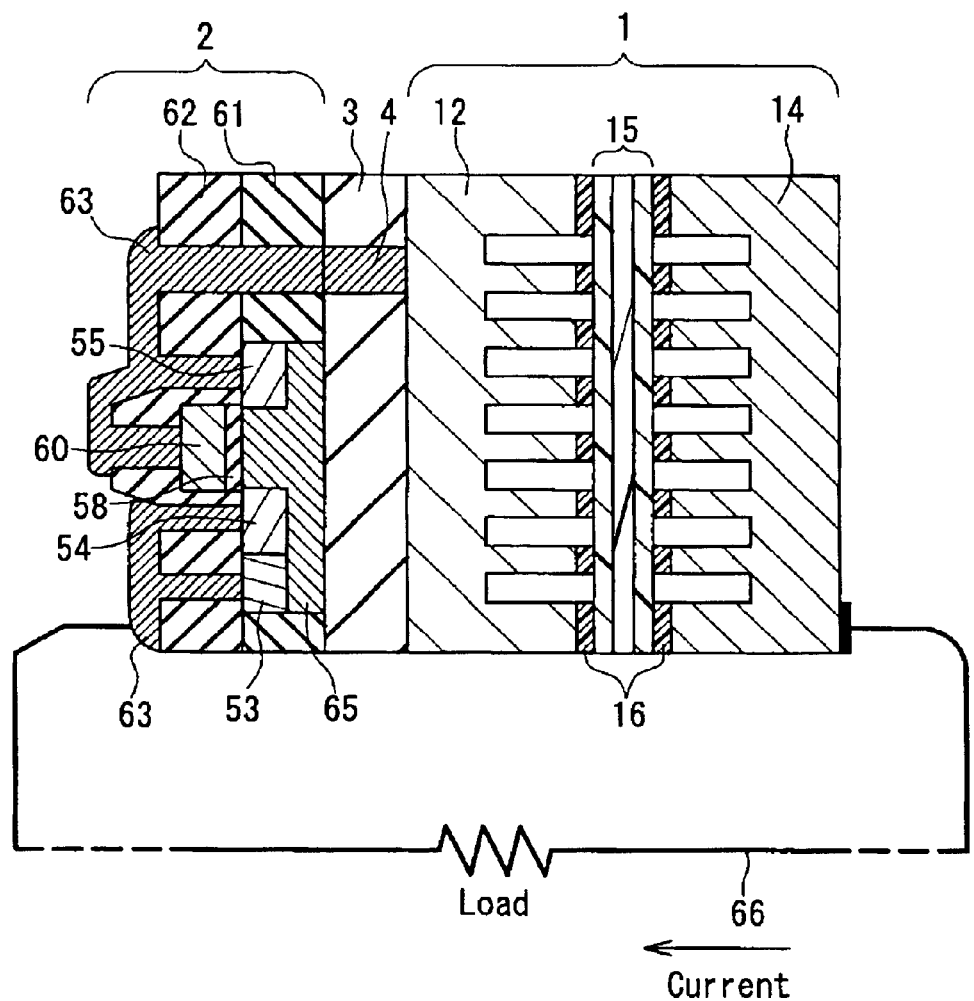
FIG. 3 is a schematic cross-sectional view illustrating still another example of a semiconductor device equipped with a fuel cell according to the present invention.

FIG. 3 is a schematic cross-sectional view illustrating still another example of a semiconductor device of the present invention.

The semiconductor device shown in FIG. 3 is a modification of the semiconductor device shown in FIG. 2 in which the semiconductor element 2 is changed from the N-channel MOS transistor to a P-channel MOS transistor.

The semiconductor element 2 shown in FIG. 3 is a P-channel MOS transistor that includes a N-well contact layer 53, a P-type source electrode 54, a P-type drain electrode 55, gate insulation films 58, a P-type gate electrode 60, an element separation insulation film 61, interlayer insulation films 62, element wiring 63, and a N-well 65. As shown in FIG. 3, the source electrode and the gate electrode of the foregoing P-channel MOS transistor are connected electrically with the anode separator 12 via an electrode 4, and the drain electrode and a substrate electrode of the same are connected electrically with the cathode separator 14 via external wiring 66. At a certain midpoint of the external wiring 66, an external load is connected to which power generated by the fuel cell 1 is supplied. With this semiconductor device, the same effect can be achieved as that achieved by the semiconductor device shown in FIG. 2.

Since an output voltage of a single cell of the PEFC type normally is not more than approximately 1 V, in some cases an interface circuit (DC-DC converter circuit, etc.) for matching a voltage used in the semiconductor element and an output voltage of the fuel cell, or a control circuit for controlling an output of the fuel cell (voltage control circuit, current control circuit, etc.) is added so that a fuel cell is used actually in a semiconductor device. In such a case, the fuel cell and a semiconductor element including the foregoing circuit are provided integrally so as to be able to provide the semiconductor device having more excellent compactness and versatility, as in the semiconductor device according to the present embodiment.

It should be noted that materials used in respective parts of the semiconductor device according to the present embodiment, thicknesses and sizes of the respective parts thereof, etc. are the same as those of the first embodiment described above.

Third Embodiment

Figure 4C:
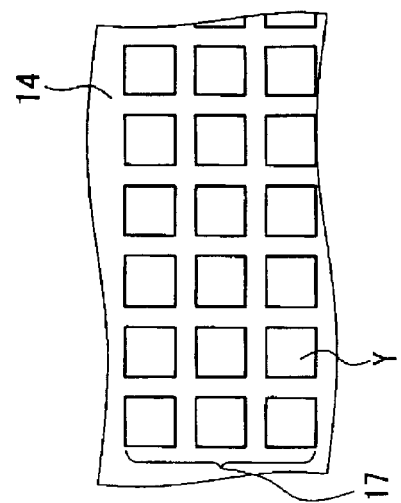
FIG. 4C is a schematic enlarged view of a part of the fuel cell shown in FIG. 4B.
Figure 4B:
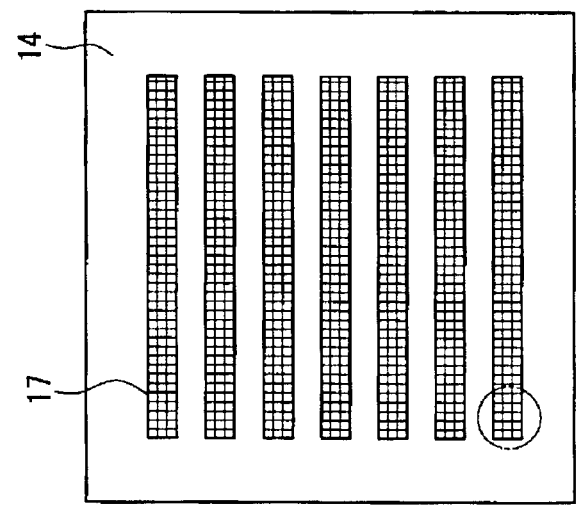
FIG. 4B is a schematic view of the fuel cell shown in FIG. 4A when it is viewed at another angle.
Figure 4A:
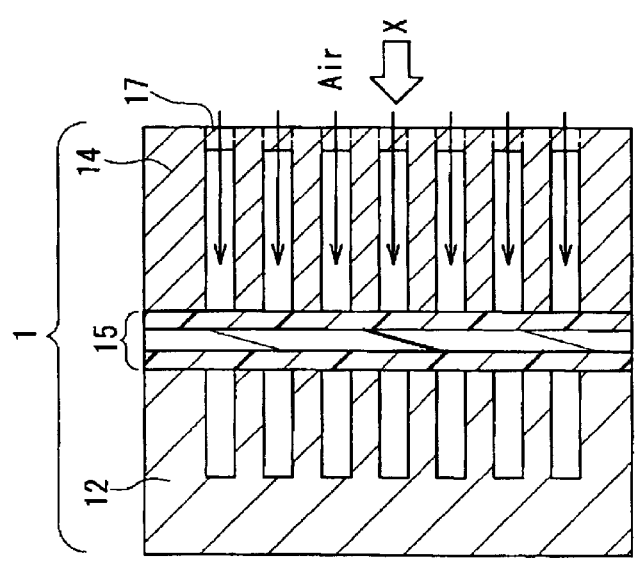
FIG. 4A is a schematic cross-sectional view illustrating an example of a fuel cell, which is to be provided in a semiconductor device equipped with a fuel cell according to the present invention.

FIG. 4A is a cross-sectional view schematically illustrating an example of a fuel cell in a semiconductor device of the present invention.

A fuel cell 1 shown in FIG. 4A includes an anode separator 12, a cathode separator 14, and a MEA 15 that is interposed between the anode separator 12 and the cathode separator 14. Openings 17 are provided in the cathode separator 14 so that flow channels of the cathode separator 14 are opened to the atmosphere.

In such a fuel cell, air is supplied as an oxidizer to the MEA by natural replacement, and hence, a device such as a pump for supplying the oxidizer can be omitted. Therefore, the use of such a fuel cell can provide the semiconductor device having more excellent compactness and versatility.

Further, in the case where the cathode separator 14 is formed with a semiconductor substrate, the openings 17 may be formed through the semiconductor processing process. The use of the semiconductor processing process, which enables minute processing, makes it possible to form each opening 17 in a lattice form for instance, as shown in FIGS. 4B and 4C. With the openings 17 formed in a lattice form, it is possible to prevent foreign matters and dusts from entering the flow channels of the separator from the outside. FIG. 4B is a schematic view of the fuel cell 1 shown in FIG. 4A viewed in a direction indicated by an arrow X shown in FIG. 4A. FIG. 4C is an enlarged schematic view of a part of the openings 17 shown in FIG. 4B (encircled part in FIG. 4B). In the opening 17, portions denoted with "Y" in FIG. 4C are portions actually opened, and thus, air is supplied to the cathode of the MEA through the portions Y The width and length of the openings 17, the size of the portions Y shown in FIG. 4C in the case where each opening 17 is formed in a lattice form, the number of the portions Y included in each opening 17, etc. are not limited particularly. They may be set appropriately according to the size of the cathode separator and required characteristics of the cell. To prevent usual foreign matters from entering the flow channels, an area of the opened portion Y may be set in a range of, for instance, 100 $\mu m^2$ to 1000 $\mu m^2$. For instance, in the case where each opening 17 has a width of 200 $\mu m$, the area of the opened portion Y may be set to be 100 $\mu m^2$, and a space between adjacent portions Y may be set to be 5 $\mu m$. Further, the thickness of a portion that is processed in a lattice form may be set appropriately.

It should be noted that materials used in respective parts of the fuel cell according to the present embodiment, thicknesses and sizes of the respective parts thereof, etc. are the same as those of the first embodiment described above.

Fourth Embodiment

Figure 5:
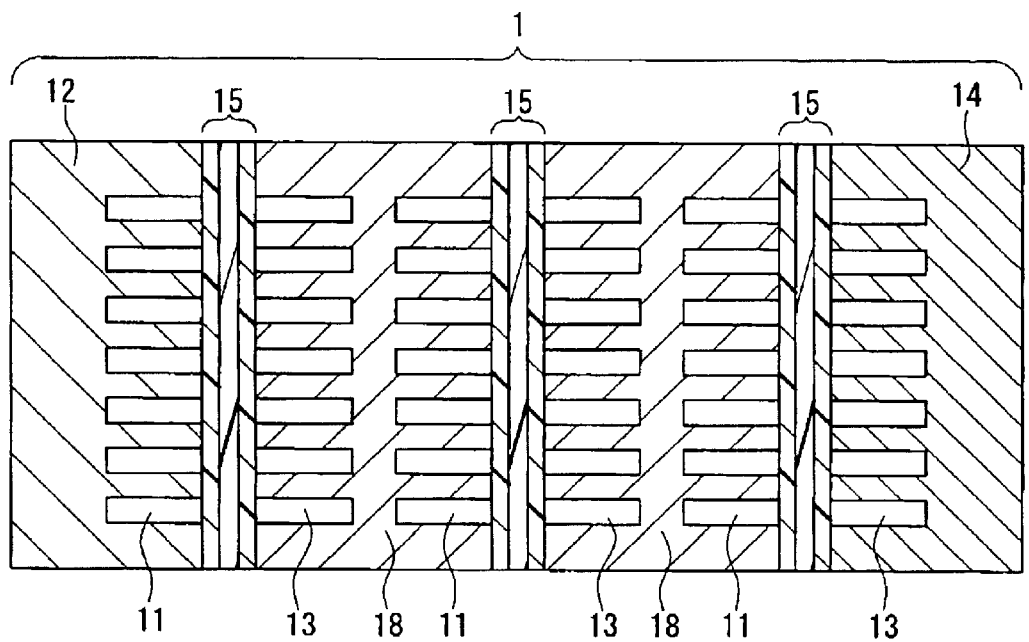
FIG. 5 is a schematic cross-sectional view illustrating another example of a fuel cell, which is to be provided in a semiconductor device equipped with a fuel cell according to the present invention.

FIG. 5 is a schematic cross-sectional view illustrating another example of a fuel cell in a semiconductor device of the present invention.

A fuel cell 1 shown in FIG. 5 is configured by stacking a plurality of single cells, each including an anode separator 12, a cathode separator 14, and a MEA 15. Further, in the fuel cell 1 shown in FIG. 5, the anode separators and the cathode separators except for separators at both ends are configured so that each pair of adjacent anode and cathode separators are integrated with each other, thereby forming a separator 18. Flow channels 11 for fuel are formed on one of principal surface of each separator 18, and flow channels 13 for oxidizer are formed on the other principal surface thereof opposite to the foregoing principal surface. The separator 18 serves as both of the anode separator and the cathode separator, and the single-cells are connected in series via the separators 18.

This configuration of a fuel cell can increase an output voltage while keeping an electric generation area of the cell unchanged. For instance, in the example shown in FIG. 5, since three cells are connected in series, an output voltage of the fuel cell increases to approximately three times that of a single cell. Further, the provision of a fuel cell in which single-cells are stacked can render the semiconductor device more excellent versatility. It should be noted that the number of stacked single-cells is not limited to three as in the example shown in FIG. 5, and may be set appropriately according to the required electric power generation characteristics.

It should be noted that to stack single-cells, there is no need to use the separators 18 each of which is formed by integrating an anode separator and a cathode separator as shown in FIG. 5. For instance, single-cells may be stacked simply. Here, layers for cooling the fuel cell may be arranged between adjacent single-cells. Further, materials used in respective parts of the fuel cell according to the present embodiment, thicknesses and sizes of the respective parts thereof, etc. are the same as those of the first embodiment described above.

Fifth Embodiment

Figure 6:
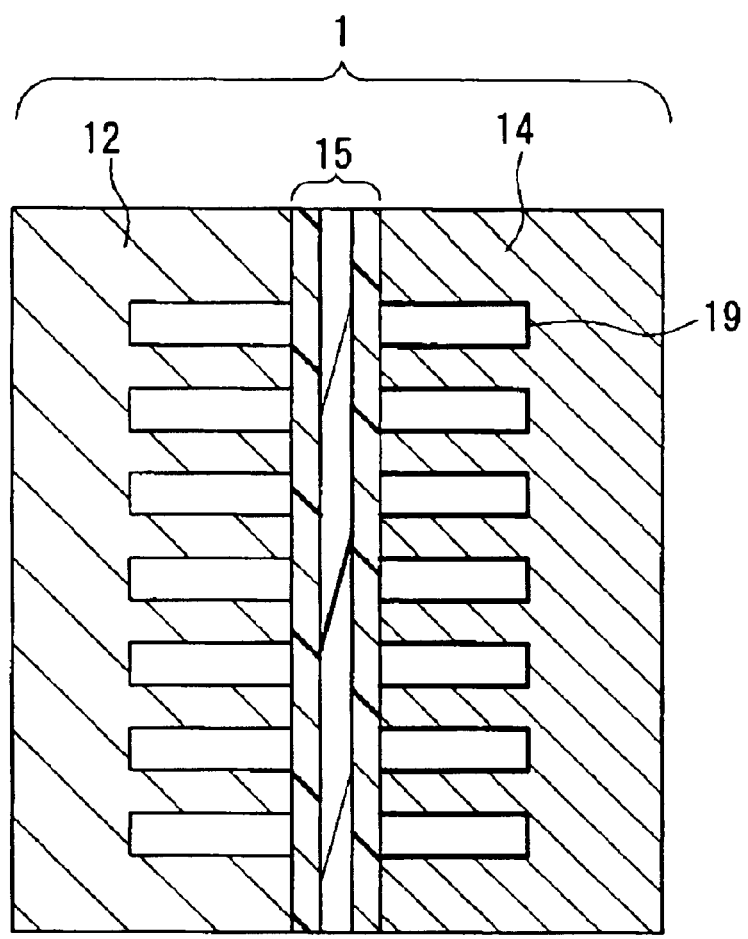
FIG. 6 is a schematic cross-sectional view illustrating still another example of a fuel cell, which is to be provided in a semiconductor device equipped with a fuel cell according to the present invention.

FIG. 6 is a cross-sectional view illustrating still another example of a fuel cell in a semiconductor device of the present invention.

A fuel cell 1 shown in FIG. 6 includes an anode separator 12, a cathode separator 14, and a MEA 15 interposed between the anode separator 12 and the cathode separator 14. Further, water-repellent layers 19 are formed on flow channels for oxidizer in the cathode separator 14.

In a PEFC, since fuel and oxidizer are supplied in a humidified state to the MEA in some cases and water is generated during electric power generation, retention of liquid water (flooding) sometimes occurs in the flow channels for fuel and oxidizer (particularly in the flow channels for oxidizer). In the case where water is retained in the flow channels, this possibly hinders the supply of fuel and oxidizer to the MEA, and decreases the electric power generation performance. In the case where an open-to-atmosphere-type separator as in the third embodiment is used as a cathode separator in particular, it is impossible to supply air as an oxidizer forcibly. Therefore, this increases a possibility that flooding occurs. Furthermore, in the case where a fuel cell is caused to perform electric power generation at a high current density, an amount of water generated increases also, which tends to cause flooding. By forming the water-repellent layers 19 on the flow channels for oxidizer in the cathode separator 14, as in the fuel cell 1 shown in FIG. 6, water is discharged efficiently from the flow channels for oxidizer. Therefore, this can provide the fuel cell having more excellent versatility. Furthermore, the provision of such a fuel cell can render the semiconductor device more excellent versatility.

The configuration of the water-repellent layers 19 is not limited particularly, as long as a water-repellent effect can be achieved. They may be formed by, for instance, forming HMDS (hexamethyldisilazane) layers by spin coating on the flow channels in the separator. Furthermore, in the case where a separator is formed with a semiconductor substrate made of crystalline silicon, water-repellent layers may be formed by projection of a laser beam or heat treatment in ultrahigh vacuum. In this case, projections and recesses of the several nanometers order are formed on a surface of the crystalline silicon by a laser beam or the like, and the water repellency can be achieved by the foregoing projections and recesses.

It should be noted that though the water-repellent layers are formed only in the cathode separator 14 in the fuel cell 1 shown in FIG. 6, they may be formed in the anode separator 12 also. Further, materials used in respective parts of the fuel cell according to the present embodiment, thicknesses and sizes of the respective parts thereof, etc. are the same as those of the first embodiment described above.

Sixth Embodiment

The following will describe a method for producing a semiconductor device as an embodiment of the present invention. It should be noted that materials used in respective parts of the semiconductor device according to the present embodiment, thicknesses and sizes of the respective parts thereof, etc. are the same as those of the first embodiment described above.

The method for producing a semiconductor device of the present invention is a method for producing a semiconductor device including a fuel cell that has a structure in which a MEA is interposed between a pair of separators. The method includes the steps of:

(i) forming a semiconductor element on one surface of a semiconductor substrate;

(ii) forming a flow channel through which either fuel or oxidizer is to flow on a surface of the semiconductor substrate that is opposite to the surface on which the semiconductor element is formed; and (iii) laminating the membrane electrode assembly on the semiconductor substrate so that the surface of the semiconductor substrate with the flow channel thereon is in contact with the membrane electrode assembly, wherein the semiconductor substrate serves as one separator selected from the pair of separators.

This producing method can be implemented by a semiconductor processing process. Therefore, it is possible to produce, with improved productivity, a compact semiconductor device with excellent versatility in which a fuel cell and a semiconductor element are integrated. Further, in the case where a large-diameter silicon wafer is used as a semiconductor substrate, a number of semiconductor devices can be produced at a time. This makes it possible to produce a semiconductor device at a lower cost.

In the foregoing producing method, the semiconductor substrate may include an insulation layer between the first and second surfaces thereof.

Further, in the foregoing producing method, the step (i) may include a sub-step of:

(a) forming the semiconductor element on the insulation layer in a manner such that the semiconductor element and the semiconductor substrate are connected electrically with each other via an electrode formed in the insulation layer.

The following describes one example of the foregoing producing method, while referring to FIGS. 7A to 7H. It should be noted that the producing method described below is a method for producing a semiconductor device in which a semiconductor element is formed on an anode separator, but this also applies to a case of a semiconductor device in which a semiconductor element is formed on a cathode separator.

Figure 7A:
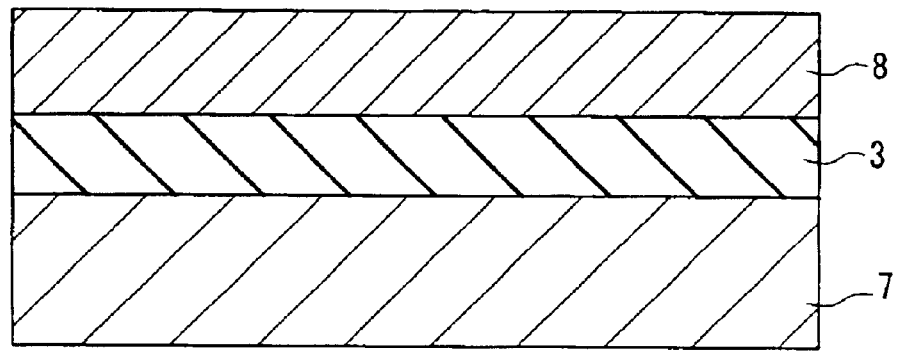
FIGS. 7A to 7H are cross-sectional views illustrating an example of a method for producing a semiconductor device equipped with a fuel cell according to the present invention.

First, a laminate in which a semiconductor substrate 7, an insulation layer 3, and a crystalline silicon layer 8 are laminated is formed (FIG. 7A). The foregoing laminate may be formed by depositing the respective layers, but a SOI substrate available in the market (for instance, a UNIBOND substrate manufactured by Silicon-On-Insulator Technologies (SOITEC)) may be used. Respective thicknesses of the foregoing layers may be set appropriately according to characteristics that the semiconductor device is required to have. Since the semiconductor substrate 7 finally becomes an anode separator, the materials thereof may be the same materials as those for the semiconductor substrate for use in the anode separator in the first embodiment. Further, a semiconductor element is formed in the crystalline silicon layer 8, which therefore finally becomes the crystalline silicon layer 51 according to the first embodiment. For instance, in the example of the UNIBOND substrate available from the market, the semiconductor substrate 7 may have a N-type conductivity, a plane direction (001), an orientation flat plane direction <110>, a specific resistance of 10 mΩ·cm, and a thickness of 650 μm. The insulation layer 3 may be made of $SiO_2$, and have a thickness of 400 nm. The crystalline silicon layer 8 has a thickness of 200 nm.

Figure 7B:
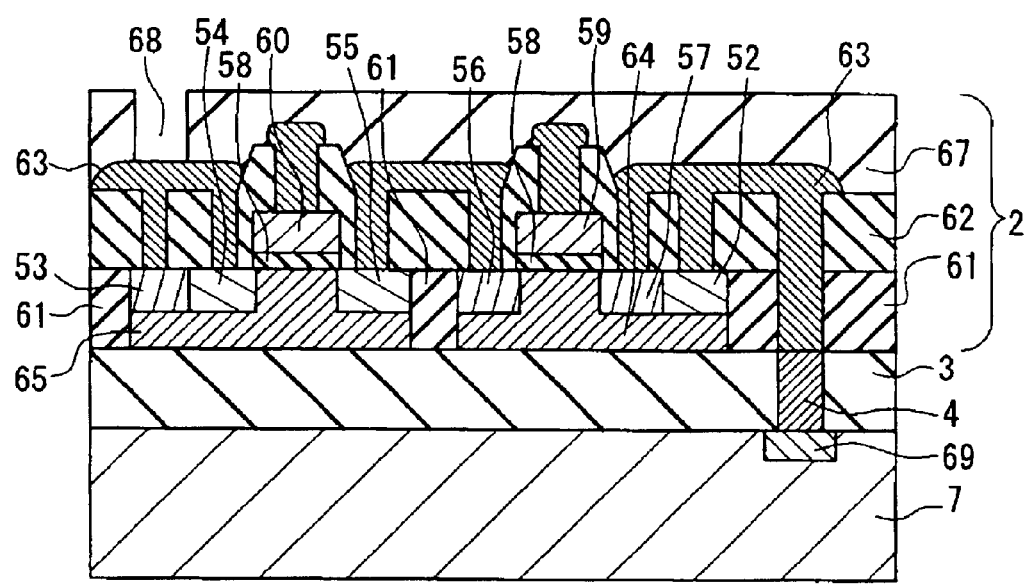

Next, a semiconductor element 2 is formed on the crystalline silicon layer 8 formed on the insulation layer 3 (FIG. 7B). In the example shown in FIG. 7B, the CMOS inverter shown in FIG. 1 is formed as the semiconductor element 2. Respective parts of the semiconductor element 2 shown in FIG. 7B basically are identical to those of the semiconductor element 2 shown in FIG. 1, and the same parts are indicated by the same reference numerals. However, the semiconductor element 2 as that shown in FIG. 7B further includes a passivation film 67 composed of a silicon nitride film formed by plasma CVD or the like, and further, an opening 68 for later connection with external wiring is provided. Furthermore, an electrode 4 for electrical connection between the semiconductor element 2 and the semiconductor substrate 7 is formed in an insulation layer 3, and a contact layer 69 is arranged so as to reduce a contact resistance between the electrode 4 and the semiconductor substrate 7.

As a process for forming the semiconductor element 2 on the insulation layer 3, a usual semiconductor element forming process (a CMOS inverter forming process in the case of the example shown in FIG. 7B) may be used. Further, the materials used in the first embodiment may be used for forming the respective parts of the semiconductor element 2 and the contact layer 69. The electrode 4 and the element wiring 63 may be formed integrally.

Next, with respect to the obtained laminate of the semiconductor element 2, the insulation layer 3, and the semiconductor substrate 7, the flow channels 11 for fuel are formed through the following steps on a surface of the semiconductor substrate 7 opposite to the foregoing surface thereof on which the insulation layer 3 and the semiconductor element 2 are formed.

Figure 7C:
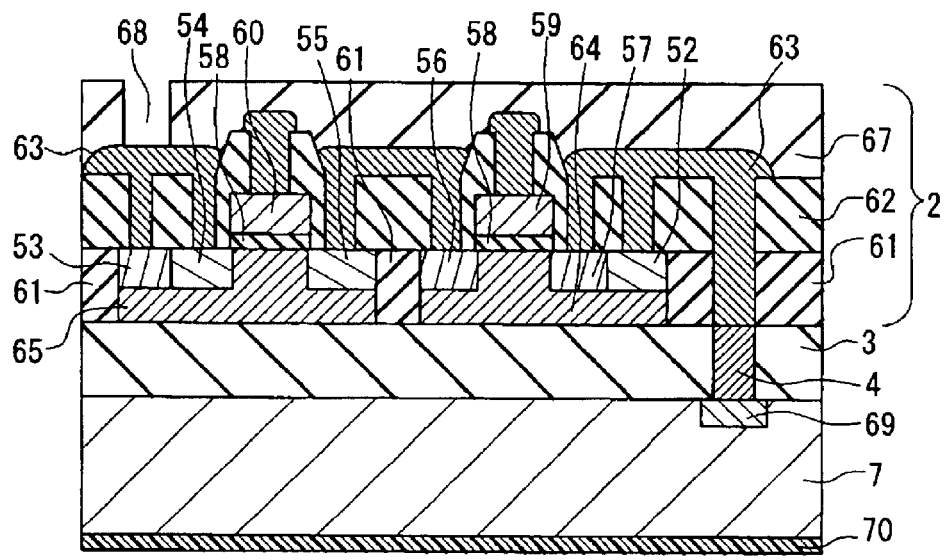

First of all, the foregoing laminate is immersed in approximately 5 wt % diluted hydrogen fluoride solution for approximately 30 seconds so that a natural oxide film on the semiconductor substrate 7 is removed. Then, ion implantation with accelerated As atoms (for instance, implantation at an acceleration voltage in a range of 10 keV to 100 keV and a dose in a range of $10^{14}$ $cm^{-2}$ to $10^{16}$ $cm^{-2}$) is carried out with respect to the surface of the semiconductor substrate 7 that is opposite to the surface having the semiconductor element 2 and the insulation layer 3 thereon, and further, a rapid heating (for instance, at 200° C. during one minute) is carried out. By so doing, a degenerated As-diffused layer 70 having a N-type conductivity is formed (FIG. 7C). The As-diffused layer 70 has a thickness in a range of, for instance, 0.01 μm to 10 μm, preferably 0.01 μm to 0.5 μm.

Figure 7D:
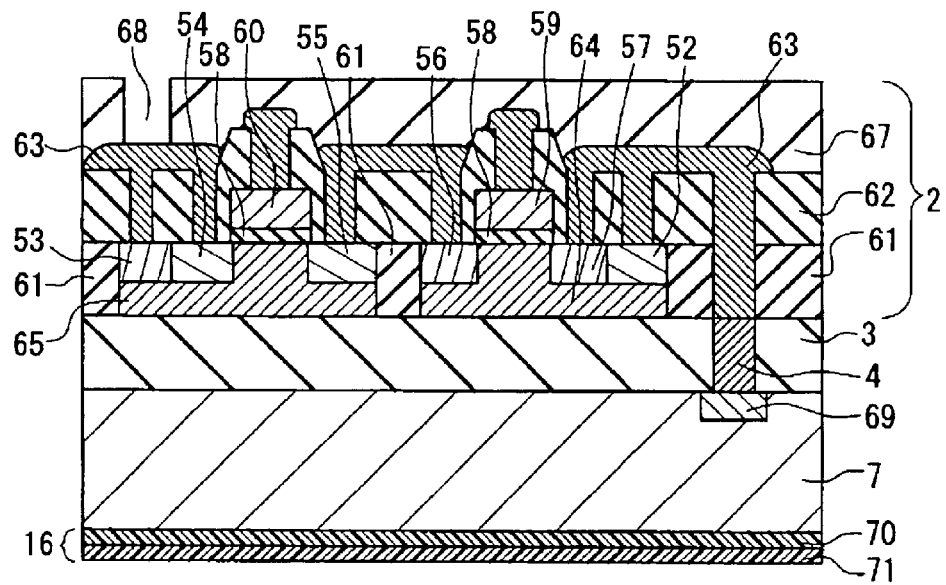
Figure 7E:
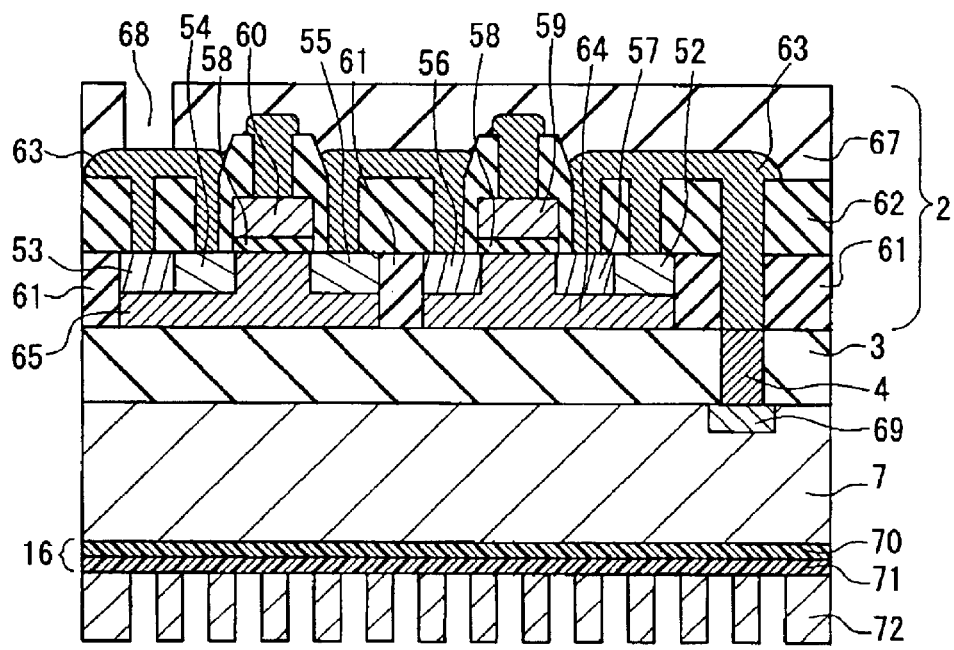

Next, nickel is deposited by sputtering or vacuum deposition to form a film on the As-diffused layer 70, and further, a rapid heating (for instance, at 400° C. during one minute, however the heating temperature being set to be lower than a melting point of element wiring 43 within the semiconductor element 2), whereby a nickel silicide film 71 is formed (FIG. 7D). Thus, a laminate film of the As-diffused layer 70 and the nickel silicide film 71 constitutes a contact layer 16. Here, by varying the type of impurity atoms implanted in the semiconductor substrate 7 and the type of atoms deposited on the impurity-diffused layer 7, the composition of the contact layer 16 can be controlled. It should be noted that the thickness of a nickel film to be deposited is in a range of, for instance, 0.01 $\mu$m to 10 $\mu$m, preferably in a range of 0.01 $\mu$m to 0.5 $\mu$m. In this case, a nickel silicide film having a thickness in a range of 0.01 $\mu$m to 10 $\mu$m (or 0.01 $\mu$m to 0.5 $\mu$m) can be formed.

Figure 7F:
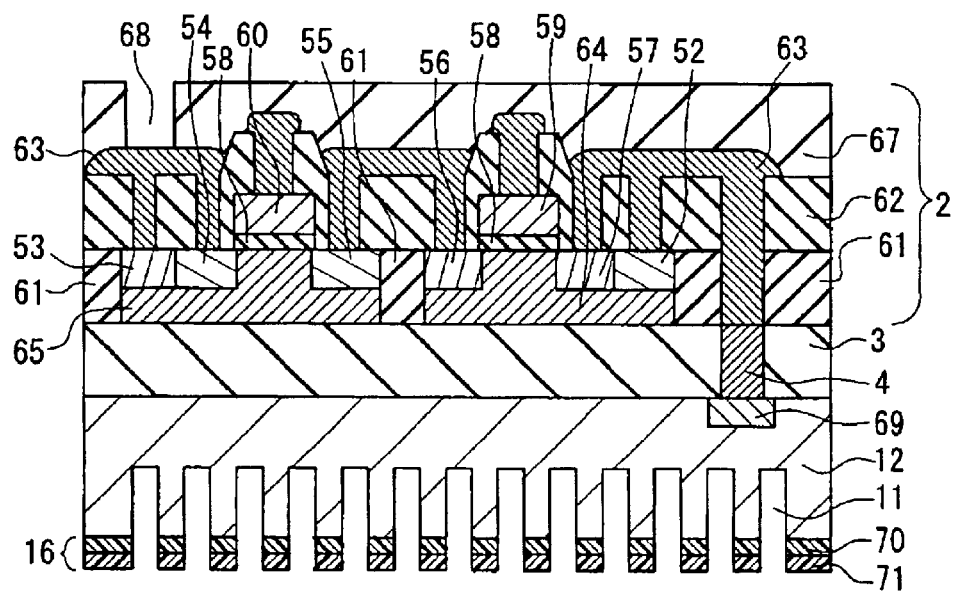

Next, a resist pattern 72 (thickness: for instance, 30 $\mu$m) that is matched with a pattern of flow channels to be formed is formed on the contact layer 16 (FIG. 7E), and thereafter, flow channels for fuel are formed on the semiconductor substrate 7 by dry etching or the like. Here, by controlling the pattern of the resist pattern 72 and the time for etching, widths and depths of the flow channels for fuel can be controlled. Thereafter, by removing the resist pattern 72, an anode separator 12 is obtained that has the insulation layer 3 and the semiconductor element 2 on one of principal surfaces thereof and the flow channels 11 for fuel on the surface opposite to the foregoing principal surface (FIG. 7F).

Figure 7G:
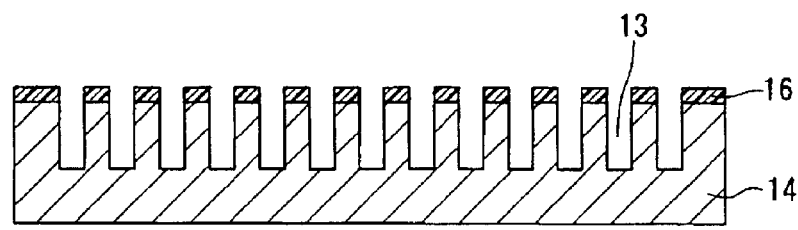

Separately from the formation of the anode separator 12, a cathode separator 14 on which flow channels 13 for oxidizer and a contact layer 16 are formed is formed by the same method as that shown in FIGS. 7C to 7F (FIG. 7G). Unlike the formation of the anode separator 12, the formation of the cathode separator 14 may start with, for instance, a step of forming an impurity-diffused layer on a single-layer semiconductor substrate.

Figure 7H:
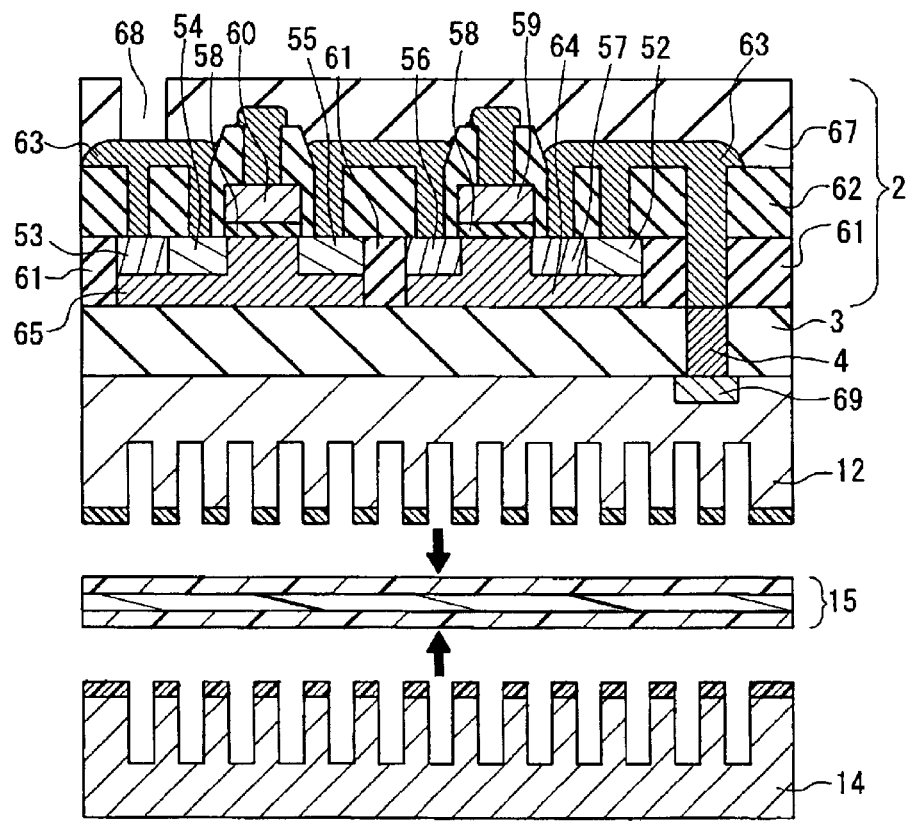

Finally, the anode separator 12 thus prepared as described above, the cathode separator 14, and an MEA 15 separately prepared are laminated so that surfaces of the separators on which flow channels are formed are brought into contact with the MEA 15 (FIG. 7H). Upon the lamination, pressure or heat may be applied as required, or the entirety may be covered with a resin or the like. Thereafter, the cathode separator 14 and the semiconductor element 2 are connected with each other via external wiring, whereby a semiconductor device as shown in FIG. 1 is obtained.

It should be noted that in the semiconductor device producing method of the present invention, in the foregoing process of producing an anode separator, the formation of the semiconductor element and the formation of the flow channels for fuel may be carried out in a reversed order (i.e., the semiconductor element may be formed after the flow channels for fuel are formed). The following describes one example of this producing method.

First, the flow channel 11 for fuel is formed on a laminate in which a semiconductor substrate, an insulation layer 3, and a crystalline silicon layer 8 are laminated. Further, a contact layer 16 is formed thereon. Here, the semiconductor substrate constitutes an anode separator 12 (FIG. 8A).

Figure 8A:
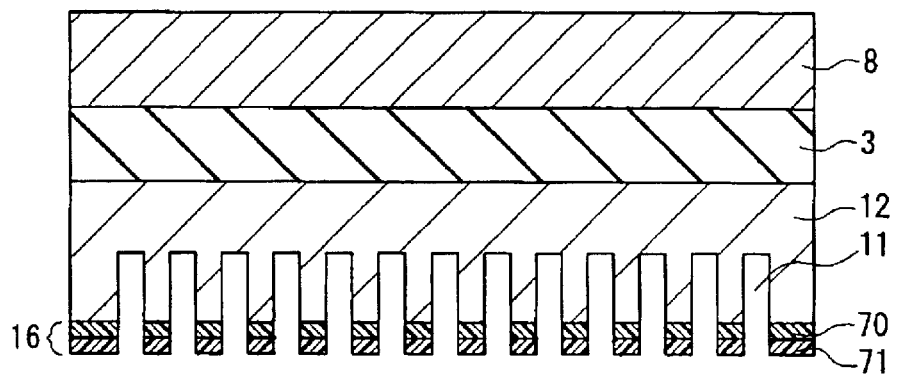
FIGS. 8A to 8B are cross-sectional views illustrating another example of a method for producing a semiconductor device equipped with a fuel cell according to the present invention.
Figure 8B:
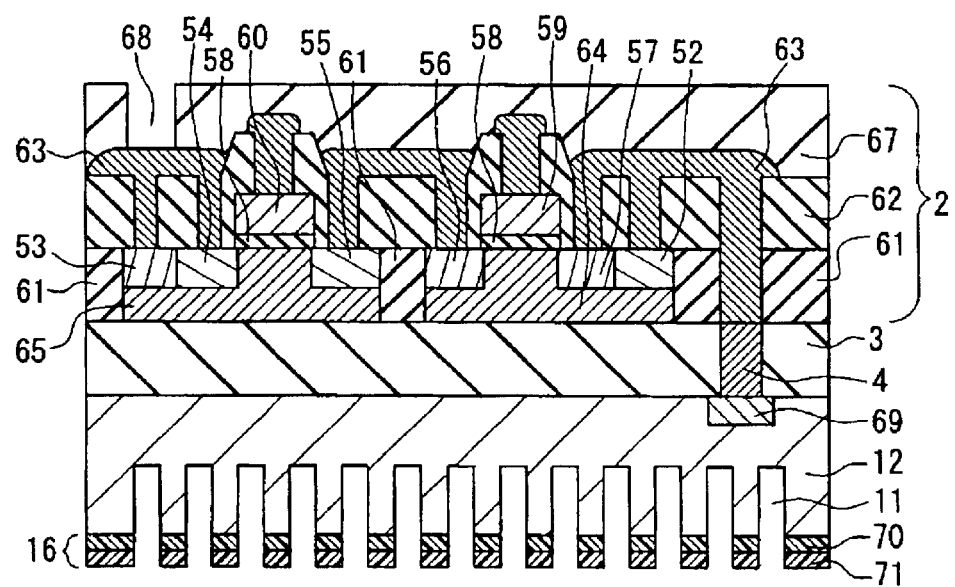

Next, by forming a semiconductor element 2 on the crystalline silicon layer 8 formed on the insulation layer 3, the anode separator 12 is obtained that has the insulation layer 3 and the semiconductor element 2 on one of principal surfaces thereof and the flow channels 11 for fuel on the surface opposite to the foregoing principal surface (FIG. 8B). Thereafter, by carrying out the same steps as those shown in FIGS. 7G to 7H, a semiconductor device as shown in FIG. 1 is obtained.

It should be noted that in the steps shown in FIGS. 8A to 8B, the method described above with reference to FIGS. 7A to 7F may be used.

As described above, the present invention can provide a further compact and versatile semiconductor device equipped with a fuel cell. Further, the present invention also provides a method for producing a semiconductor device equipped with a fuel cell, which is capable of producing a semiconductor device equipped with the fuel cell with improved productivity. The semiconductor device of the present invention can be used in an electronic circuit device, a power source, a light source, a micromachine, a microsensor, etc.

The invention may be embodied in other forms without departing from the spirit or essential characteristics thereof. The embodiments disclosed herein are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device equipped with a fuel cell, the semiconductor device comprising a fuel cell and a semiconductor element,
   wherein
   the fuel cell includes a plate-type anode separator in which a flow channel for fuel is formed, a plate-type cathode separator in which a flow channel for oxidizer is formed, and a membrane electrode assembly interposed between the anode separator and the cathode separator,
   the semiconductor element is formed on a principal surface of one separator selected from the anode separator and the cathode separator,
   the membrane electrode assembly is in contact with a surface of the selected separator that is opposite to the principal surface on which the semiconductor element is formed,
   the anode separator and the cathode separator function as charge collectors for collecting electric power generated in the membrane electrode assembly, and
   the semiconductor element and the selected separator are connected electrically.

2. The semiconductor device according to claim 1, wherein two of the semiconductor elements are included, the semiconductor elements being a first semiconductor element formed on a principal surface of the anode separator, and a second semiconductor element formed on a principal surface of the cathode separator.

3. The semiconductor device according to claim 1, wherein the selected separator is formed with a semiconductor substrate.

4. The semiconductor device according to claim 3, wherein the semiconductor substrate is made of crystalline silicon.

5. The semiconductor device according to claim 3, wherein the semiconductor substrate is made of a compound semiconductor containing an element of the group IIIb and an element of the group Vb.

6. The semiconductor device according to claim 3, wherein the semiconductor substrate is made of a compound semiconductor containing an element of the group IIb and an element of the group VIb.

7. The semiconductor device according to claim 3,
wherein the anode separator is formed with a N-type semiconductor substrate and the cathode separator is formed with a P-type semiconductor substrate.

8. The semiconductor device according to claim 3,
wherein the fuel cell further includes a contact layer arranged between the selected separator and the membrane electrode assembly so as to reduce a contact resistance between the selected separator and the membrane electrode assembly.

9. The semiconductor device according to claim 1,
wherein the fuel cell further includes an insulation layer formed between the principal surface of the selected separator on which the semiconductor element is formed and the surface of the selected separator that is in contact with the membrane electrode assembly.

10. The semiconductor device according to claim 9,
wherein the principal surface of the selected separator on which the semiconductor element is formed is connected electrically with the surface of the selected separator that is in contact with the membrane electrode assembly via an electrode formed in the insulation layer, and
electric current generated in the membrane electrode assembly is supplied to the semiconductor element.

11. The semiconductor device according to claim 9,
wherein the insulation layer is made of $SiO^2$.

12. The semiconductor device according to claim 9,
wherein the insulation layer has a specific resistance of not less than $10^5$ Ω·cm.

13. The semiconductor device according to claim 9,
wherein the insulation layer has a thickness in a range of 10 nm to 1 μm.

14. The semiconductor device according to claim 9,
wherein the selected separator is made of a metal.

15. The semiconductor device according to claim 14,
wherein the insulation layer is a metal oxide film.

16. The semiconductor device according to claim 1,
wherein
the semiconductor element includes a first electrode and a second electrode,
the first electrode is connected electrically with the anode separator, and
the second electrode is connected electrically with the cathode separator.

17. The semiconductor device according to claim 1,
wherein
the semiconductor element is a N-channel MOS transistor,
a source electrode and a substrate electrode of the N-channel MOS transistor are connected electrically with the anode separator, and
a drain electrode and a gate electrode of the N-channel MOS transistor are connected electrically with the cathode separator.

18. The semiconductor device according to claim 1,
wherein
the semiconductor element is a P-channel MOS transistor,
a source electrode and a gate electrode of the P-channel MOS transistor are connected electrically with the anode separator, and
a drain electrode and a substrate electrode of the P-channel MOS transistor are connected electrically with the cathode separator.

19. The semiconductor device according to claim 1,
wherein the fuel cell is formed by stacking a plurality of cells, each cell including the anode separator, the cathode separator, and the membrane electrode assembly.

* * * * *